(12) United States Patent     (10) Patent No.:   US 12,626,043 B2

Jiang et al.            (45) Date of Patent:     May 12, 2026

(54) AUTOMATIC TEST PATTERN GENERATION TO INCREASE COVERAGE IN DETECTING DEFECTS IN ANALOG CIRCUITS

(71) Applicant: Synopsys, Inc., Mountain View, CA (US)

(72) Inventors: Peilin Jiang, Santa Clara, CA (US); Mayukh Bhattacharya, Palo Alto, CA (US)

(73) Assignee: Synopsys, Inc., Sunnyvale, CA (US)

( * ) Notice: Subject to any disclaimer, the term of this patent is extended or adjusted under 35 U.S.C. 154(b) by 728 days.

(21) Appl. No.: 18/064,734

(22) Filed: Dec. 12, 2022

(65) Prior Publication Data

US 2024/0193336 A1     Jun. 13, 2024

(51) Int. Cl.
    *G06F 30/367*       (2020.01)
(52) U.S. Cl.
    CPC ................................. *G06F 30/367* (2020.01)
(58) Field of Classification Search
    CPC ............................ G06F 30/367; G01R 31/316
    See application file for complete search history.

(56) References Cited

U.S. PATENT DOCUMENTS

| | | | |
|---|---|---|---|
| 8,813,004 B1 * | 8/2014 | O'Riordan ............ | G06F 30/367 |
| | | | 716/112 |
| 10,657,207 B1 * | 5/2020 | Tang ..................... | G06F 30/333 |
| 10,783,296 B1 * | 9/2020 | Ershov .................. | G06F 30/327 |
| 11,227,091 B1 * | 1/2022 | Tang ..................... | G06F 30/333 |
| 11,435,401 B1 * | 9/2022 | Chokhani ...... | G01R 31/318357 |
| 2013/0054161 A1 * | 2/2013 | Hapke ................... | G06F 30/367 |
| | | | 702/58 |
| 2018/0060472 A1 * | 3/2018 | Chen .............. | G01R 31/318342 |
| 2018/0253346 A1 * | 9/2018 | Tang .................... | G06F 11/079 |
| 2021/0264087 A1 * | 8/2021 | Jiang ..................... | G06F 30/398 |
| 2022/0065929 A1 * | 3/2022 | Lin .................. | G01R 31/31724 |
| 2024/0160823 A1 * | 5/2024 | Mukherjee ........... | G06F 30/367 |
| 2025/0232101 A1 * | 7/2025 | Rathore ............... | G06F 30/367 |

* cited by examiner

*Primary Examiner* — Nha T Nguyen
(74) *Attorney, Agent, or Firm* — Fenwick & West LLP

(57)         ABSTRACT

Test patterns are generated to test for a specified defect in an analog circuit by applying a succession of different strategies. Each strategy efficiently determines nominal responses and defect responses of the analog circuit to trial test patterns. The nominal response is a response of the analog circuit without the specified defect, and the defect response is a response of the analog circuit with the specified defect. Test patterns are selected based on differences between the nominal and defect responses.

16 Claims, 10 Drawing Sheets

800

AUTOMATIC TEST PATTERN GENERATION TO INCREASE COVERAGE IN DETECTING DEFECTS IN ANALOG CIRCUITS

TECHNICAL FIELD

The present disclosure generally relates to an electrical design automation (EDA) system. In particular, the present disclosure relates to automatic test pattern generation to increase coverage of defects in analog circuits.

BACKGROUND

Testing for defects is a step in the manufacture of integrated circuits. In some testing scenarios, a test pattern is applied to the circuit under test. The response of the circuit to the test pattern is observed and compared to the expected (nominal) response. Deviations between the observed and nominal responses may indicate a defect in the circuit. In digital circuits, signal values are interpreted as a logic 0 or a logic 1 so a defect is present if a 0 is observed when a 1 is expected or vice versa. Detecting defects in analog circuits is not as well-defined, since the signal values are expected to take a range of values and deviations between observed and nominal will also span a range of values.

The ease with which a defect in an analog circuit may be detected depends in part on the test pattern applied to the circuit. In a common approach, randomly generated waveforms are applied as test patterns. However, if a particular defect is hard to detect (e.g., produces a weak deviation from nominal) or requires a specific type of test pattern to detect, then testing based on randomly generated waveforms may not detect this defect.

SUMMARY

In one aspect, test patterns are generated to test for a specified defect in an analog circuit by applying a succession of different strategies. Each strategy determines nominal responses and defect responses of the analog circuit to trial test patterns. The nominal response is a response of the analog circuit without the specified defect, and the defect response is a response of the analog circuit with the specified defect. Test patterns are selected based on the differences between the nominal and defect responses.

For example, one of the strategies may be based on an alternating-current (AC) simulation of the analog circuit and another may be based on a transient (time-based) simulation of the analog circuit. Analog circuits have nonlinear behavior. The AC simulation assumes small signals and linearizes the behavior of the analog circuit based on this assumption. The AC simulation may be sped up by implementing it in the frequency domain and by interpolating the frequency response of the circuit based on a limited number of frequency samples, rather than expressly sampling at all frequencies. The transient simulation is a time-based simulation of the circuit, but it can be computationally expensive. It may be sped up by using a model, such as a machine learning model, of the transient simulation rather than executing the simulation each time required.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompany-ing figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
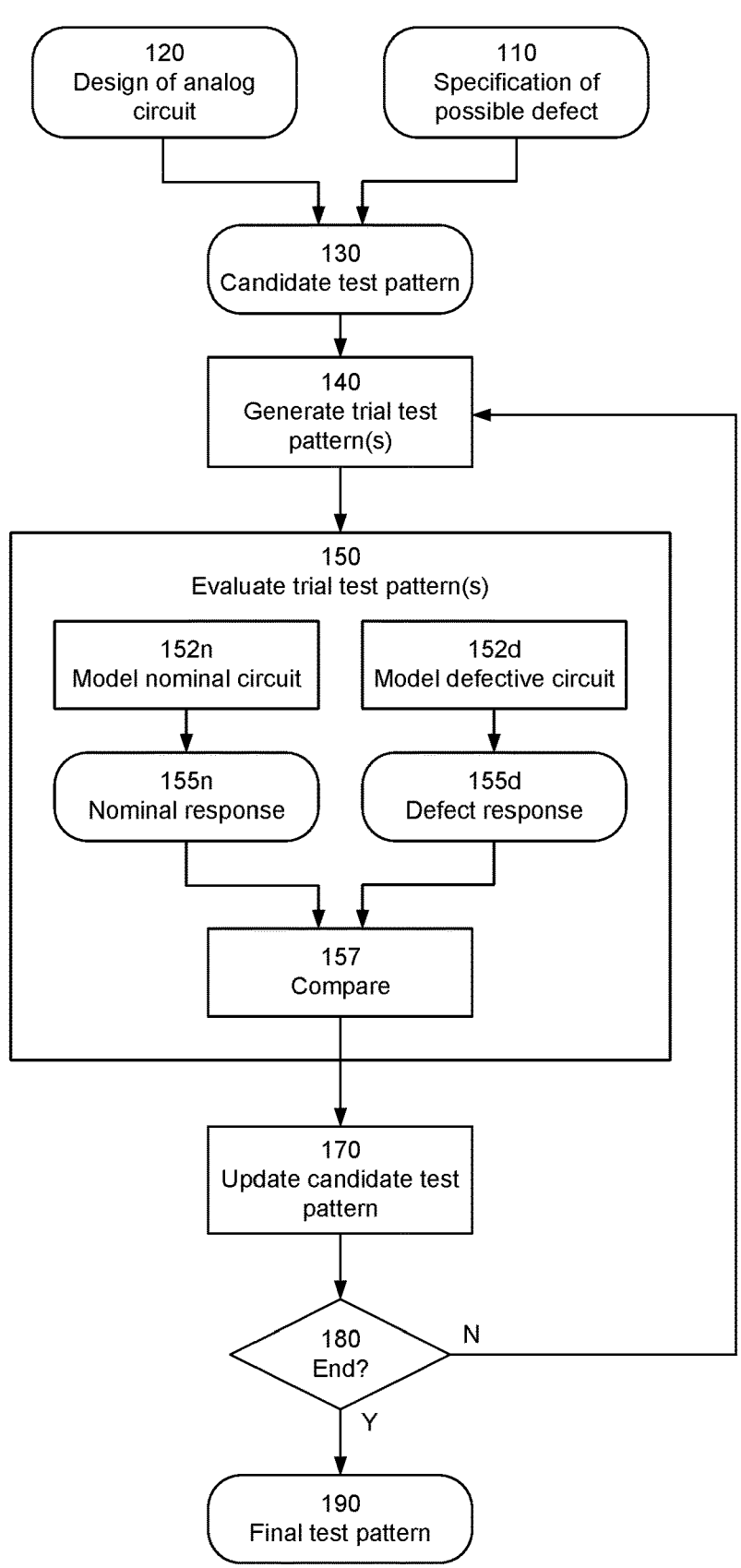
FIG. 1 is a flow diagram for generating a test pattern according to some embodiments of the disclosure.

Aspects of the present disclosure relate to automatic test pattern generation to increase coverage in detecting defects in analog circuits. To test an analog circuit, a test pattern is applied to the circuit, the response of the circuit to the test pattern is observed and a comparison of the observed and nominal responses indicates whether a defect exists. However, defects in analog circuits may not be as well-defined as for digital circuits, which makes detection of those defects also less well-defined and more difficult. Randomly generated test patterns may be used. However, it is then random whether the resulting test patterns will produce an observed response that deviates sufficiently from the nominal response to reliably detect a defect.

As an alternative, it is desirable to purposely design test patterns to detect specific defects. For a specified defect, the test pattern may be designed so that the difference between the response from the circuit without the defect (the nominal response) and the response from the circuit with the defect (the defect response) is increased or even maximized. However, such a process may require multiple iterations evaluating many different trial test patterns, which involves determining the responses for the many different trial test patterns. This may be done by simulating the analog circuit's response to each trial test pattern. However, the simulation of analog circuits may be based on time stepping through the circuit's response, and these transient simulations are computationally expensive.

As described in more detail below, various techniques may be used to speed up this process compared to using a transient simulation to evaluate every trial test pattern. One technique is based on alternating-current (AC) simulation of the circuit, which is computationally much cheaper than transient simulation. In addition, a fast frequency sweep approach based on characteristic basis functions may be used to further reduce the computation time. Another technique is based on surrogate models for analog circuits which can generate the responses of the circuits for different test patterns but without running the full transient simulation. For example, the surrogate models may be machine learning models trained on prior transient simulations. Yet another technique is to use a succession of strategies to determine test patterns. Direct-current (DC) simulation may be applied first. If necessary, AC simulation may be applied next and then finally transient simulation.

Technical advantages of the present disclosure include, but are not limited to, the following. The present system and method generate test patterns that are specific for detecting particular defects, which in turn increases the reliability of detecting those defects. In addition, test coverage (the number of defects that can be detected) is increased when more defects are detectable by the test patterns.

Conversely, if test patterns cannot be generated to specifically detect for certain defects, this helps to determine that testing will not detect such defects. Moreover, it also suggests that the importance of such defects is less because they do not change the circuit response sufficiently to be detectable.

The various techniques described below are also advantageous because they make automatic test pattern generation more efficient. They can execute in less run-time, occupy less memory and consume fewer processing cycles. The faster run-time means that test patterns can be generated in less time. Alternatively, more or better test patterns can be generated in the same amount of time. As described below, various techniques may also be executed in parallel, thus reducing the actual time to generate test patterns.

FIG. 1 is a flow diagram for generating a test pattern. The test pattern may be determined to detect a specified defect which may occur in an analog circuit, as defined by the defect specification 110 and design database 120, respectively. Examples of analog circuits include analog-to-digital and digital-to-analog converters, amplifiers, analog filters, and phase locked loops. Examples of defects include hard defects such as open circuits and short circuits. Defects can also include softer defects, such as deviation of the values (e.g., resistance, capacitance, and oxide dimensions) of certain components in the circuit from their nominal values. The defect may be predefined, such as from a list of defects. Alternatively, the defect may be user-defined.

To test the fabricated analog circuit, the test pattern is applied to the circuit and the resulting responses are observed. The test pattern may be one or more waveforms applied to different points in the circuit, for example as inputs to the circuit. The observed responses may be waveforms produced by the analog circuit, such as outputs of the circuit. The responses may be signal waveforms over a period of time, signal values at a specific time, or measures derived from these (such as gain or linearity of an amplifier).

The test pattern is determined so that the response from the circuit without the defect may be easily distinguished from the response from the circuit with the defect. In FIG. 1, the automatic test pattern generation is an iterative process with multiple iterations as indicated by the end condition 180 and corresponding loop. Each iteration starts with a candidate test pattern 130. For the first iteration, this may be randomly generated or the result of some other process. For later iterations, this may be the current best test pattern. At 140, one or more trial test patterns are generated based on the current candidate test pattern 130. The trial test patterns are applied to a model of the nominal circuit (i.e., the circuit with no defect) and to a model of the defective circuit, at 152*n* and 152*d*, to determine the corresponding responses: nominal response 155*n* and defect response 155*d*. At 157, the two responses 155*n* and 155*d* are compared to determine whether the presence of the defect produces a difference in the responses 155*n*,155*d*. On each iteration, there may be multiple trial test patterns. For example, there may be nested iterations within the main loop, or different trial test patterns may be evaluated in parallel, as described in more detail below. At 170, the current candidate test pattern may be updated, based on the results of the comparison of the nominal and defect responses 155*n* and 155*d* for the different trial test patterns. The iterations are repeated until an ending criteria is met, at 180, at which point the process produces the final test pattern(s) 190. The end condition 180 could be that the change in the difference between the nominal and defective circuit responses falls below a threshold. Alternatively, the end condition 180 may be that the number of iterations has reached a certain value.

In more detail, the flow in FIG. 1 attempts to find an optimal test pattern (TP), where optimal is defined as maximizing the difference between responses from the nominal and defective circuits. That is, $$\text{Optimal } TP = \underset{TP}{\text{argmax}} \frac{\|R_n - R_d\|}{\|R_n\|} \qquad (1)$$

where $R_n$ is the response from the nominal circuit, $R_d$ is the response from the defective circuit, and $\|\cdot\|$ is a norm or other measure of distance or similarity. In FIG. 1, the responses $R_n$ and $R_d$ are determined at 152*n* and 152*d*. This may be done by applying a time-stepping circuit simulation (i.e., transient simulation) for each trial test pattern. However, transient simulations are computationally expensive. Given that there may be many iterations, there may be multiple trial test patterns in each iteration, and this will be done for both nominal and defective circuits, it is beneficial to develop other, less computationally expensive strategies for determining the responses $R_n$ and $R_d$.

One strategy is based on alternating-current (AC) simulations, instead of transient simulations. AC simulation is based on a small-signal assumption. The analog circuit may be non-linear. Under the small-signal assumption, the analog circuit is modeled as linear in the vicinity of some operating point. Therefore, the governing equation for the analog circuit can be written as follows in the frequency domain:

$$(j\omega A + B)R(\omega) = F(\omega) \qquad (2)$$

Matrices A and B represent the small-signal behavior of a particular circuit. They can be determined from the linearized equations that govern the behavior of the circuit. A and B are frequency-independent since the circuit is modeled as linear. Matrices A and B are calculated for both the nominal circuit and for the defective circuit (or for multiple defective circuits if multiple defects are considered). F($\omega$) is a vector that is a frequency domain representation of the excitation of the circuit (e.g., the test pattern), and R($\omega$) is a vector that is a frequency domain representation of the corresponding response. For a specific frequency $\omega$, each element of vectors F($\omega$) and R($\omega$) represents the signals at various nodes of the circuit at that particular frequency $\omega$. There will be multiple vectors F($\omega$) and R($\omega$) at different frequencies $\omega$ to represent the full sets of excitation and response signals at different nodes of the circuit.

Assume that vectors F and R have size K (although F and R are not required to be the same size). K generally will be quite large. Designing the test pattern F then has K degrees of freedom, as the waveform at each node of F must be determined to define the final test pattern. Furthermore, each of the K waveforms may be represented by J frequency samples, which further increases the degrees of freedom.

For each frequency component $\omega$, the linear equation (2) may be solved for the response $R(\omega)$ of the circuit under excitation $F(\omega)$ at frequency $\omega$. The responses $R(\omega)$ of the circuit for excitations at J different frequencies is calculated, which may be very time consuming. This can be accelerated by using characteristic basis functions (CBF). In this strategy, the response of the circuit at any frequency is represented as the linear combination of the responses at a smaller number of sample frequencies, referred to as basis frequencies. The responses at those basis frequencies are referred to as CBFs. In this way, the dimensionality of system equation (2) may be reduced significantly.

Figure 2:
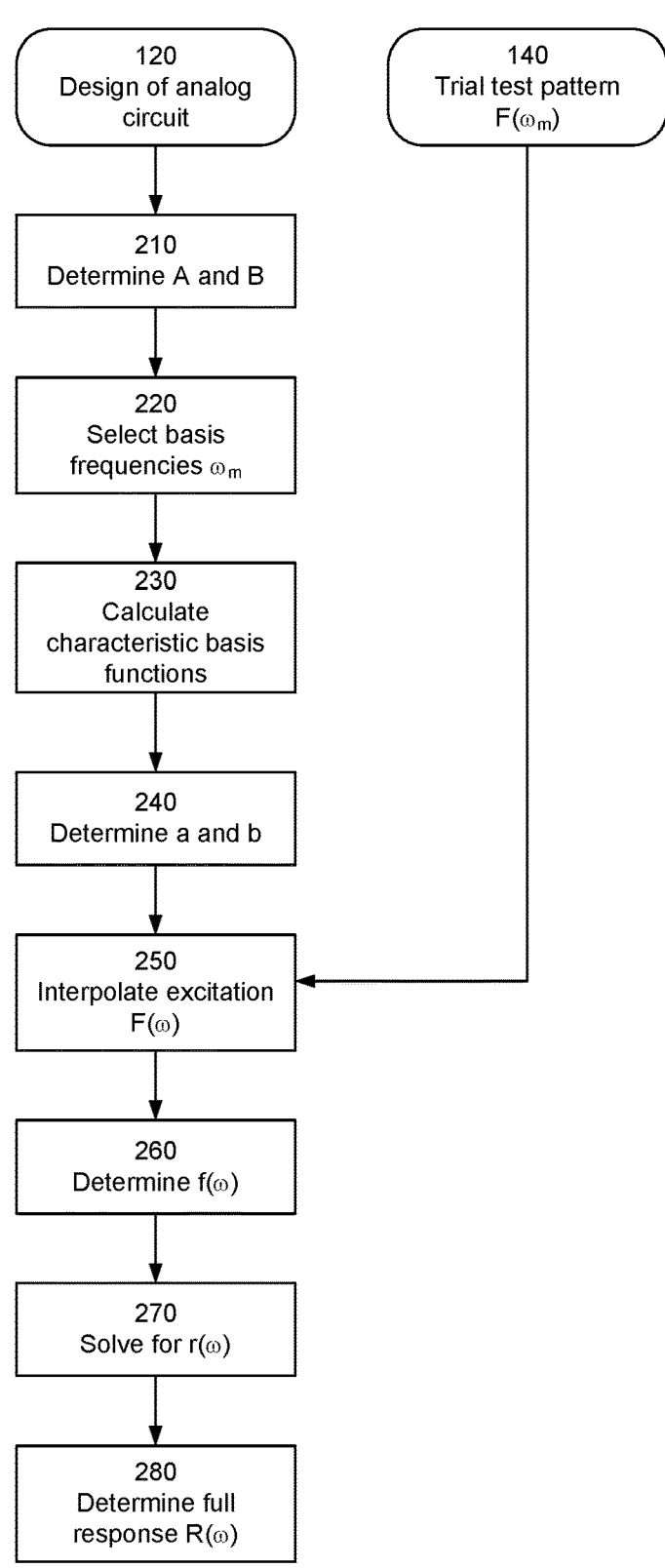
FIG. 2 is a flow diagram for AC simulation according to some embodiments of the disclosure.

FIG. 2 is a flow diagram of AC simulation used to accelerate circuit modeling (step 152 of FIG. 1) using characteristic basis functions. The flow of FIG. 2 may be used to calculate both the nominal response 155n and the defect response 155d, so the subscripts n and d are not used in FIG. 2. At 210, the matrices A and B are determined from the circuit design 120 using the small-signal approximation.

At 220, M basis frequencies $\omega_m$, m=1 to M, are selected with M<J. Because K may be very large, usually M<K also. The basis frequencies may be uniformly spaced if the system response has a smooth frequency spectrum. If there are resonances in the system response, more samples may be taken around the resonances to adequately sample the system response. An adaptive scheme may be used to automatically determine which frequencies are selected as the basis frequencies.

At 230, the responses $R(\omega_m)$ of the circuit at each basis frequency $\omega_m$ is calculated. The responses $R(\omega_m)$ may be determined by selecting an excitation $F(\omega_m)$ and then solving for $R(\omega m)$ in Eqn. (2). The responses may be expressed as a matrix $$X=[R(\omega_1),R(\omega_2), \ldots ,R(\omega_M)] \tag{3}$$

where the vectors $R(\omega_m)$ are the CBFs. Each CBF $R(\omega_m)$ is the response of the circuit to an excitation at basis frequency $\omega_m$. The response $R(\omega)$ at any frequency $\omega$ can be written as a weighted sum of the CBFs:

$$R(\omega)=Xr(\omega) \tag{4}$$

where $r(\omega)$ are the weights.

The governing equation (2) can be rewritten as $$X^H(j\omega A+B)Xr(\omega)=X^HF(\omega) \tag{5}$$

where the superscript H denotes the Hermitian transpose. Equivalently, Eqn. (5) may be expressed as $$(j\omega a + b)r(\omega) = f(\omega), \tag{6}$$

where $a = X^H A X$ $b = X^H B X$, and $f(\omega) = X^H F(\omega).$

Note that matrices a and b are M×M matrices, which are much smaller than the K×K matrices A and B. Therefore, this reduced governing Eqn. (6) can be solved in a direct manner in a shorter time. At 240, the matrices a and b are determined using Eqn. (6) above, since X, A and B are known.

A trial test pattern 140 is represented by the excitation $F(\omega_m)$ at the M basis frequencies. At 250, the excitation $F(\omega)$ at other frequencies a may be determined by interpolation of the $F(\omega_m)$. At 260, $f(\omega)$ may be determined from the excitation $F(\omega)$ using Eqn. (6) above. At 270, Eqn. (6) may be solved for $r(\omega)$, since a, b and $f(\omega)$ are known. At 280, the full response $R(\omega)$ may be determined from Eqn. (4). The full response $R(\omega)$ corresponds to the response 155n, 155d in FIG. 1.

The excitation $F(\omega)$ may be written as $$F(\omega)=F_r(\omega)+jF_i(\omega) \tag{7}$$

where $F_r(\omega)$ and $F_i(\omega)$ are the real and imaginary parts, respectively. The objective is to find the values of the real and imaginary parts of the excitation at the M basis frequencies of the CBFs to maximize the difference between the responses from the nominal and the defective circuits. That is, $$\text{Optimal } TP = \underset{F(\omega_m)}{\arg\max} \frac{\int |R_n(\omega) - R_d(\omega)|^2 d\omega}{\int |R_n(\omega)|^2 d\omega} \tag{8}$$

Here $F(\omega)$ and $R(\omega)$ are frequency domain representations of the test pattern and resulting responses. The integrals may be evaluated using trapezoidal rule or other numerical integration technique, based on the responses of the circuit determined at the M basis frequencies $\omega_m$, as described in FIG. 2. As a result of the acceleration by the CBF technique, this can be completed more quickly than an approach that directly uses the K×K matrices A and B.

In addition, steps 210-240 in FIG. 2 do not depend on the trial test pattern. Therefore, they may be performed once for all trial test patterns. In FIG. 1, steps 210-240 may be performed outside the loop defined by condition 180.

The optimization using matrices A and B represents excitation F using K degrees of freedom. Under the CBF approach, excitation F has M degrees of freedom with M<K. The variables to be optimized are the excitations at the basis frequencies, $F(\omega_m)$.

AC simulation may not meet the accuracy requirements if the circuit is highly nonlinear. In those cases, transient simulation may be used when calculating the circuit response to a test pattern. The objective function may be expressed as $$\text{Optimal } TP = \underset{F(t_i)}{\arg\max} \frac{\int |R_n(t) - R_d(t)|^2 dt}{\int |R_n(t)|^2 dt} \tag{9}$$

Here F(t) and R(t) are time domain representations of the test pattern and resulting responses. $F(t_i)$ are samples of the test pattern taken at different samples times $t_i$. To have good accuracy, the responses at a fair number of time steps are needed. However, this is a large degree of freedom. It may be impractical to call a transient simulator directly when optimizing the test pattern for analog circuits, especially when the circuits are relatively large. To mitigate this difficulty, surrogate models may be used to replace the simulator and give accurate enough responses of the circuits in shorter time.

In one approach, the surrogate model is a machine learning model. It is built on precalculated responses of the nominal and the defective circuits subject to random test patterns, which form the training sets for the machine learning models. As an example, the neural network autoregressive exogenous (NNARX) model is adopted as the surrogate model.

Figure 3:
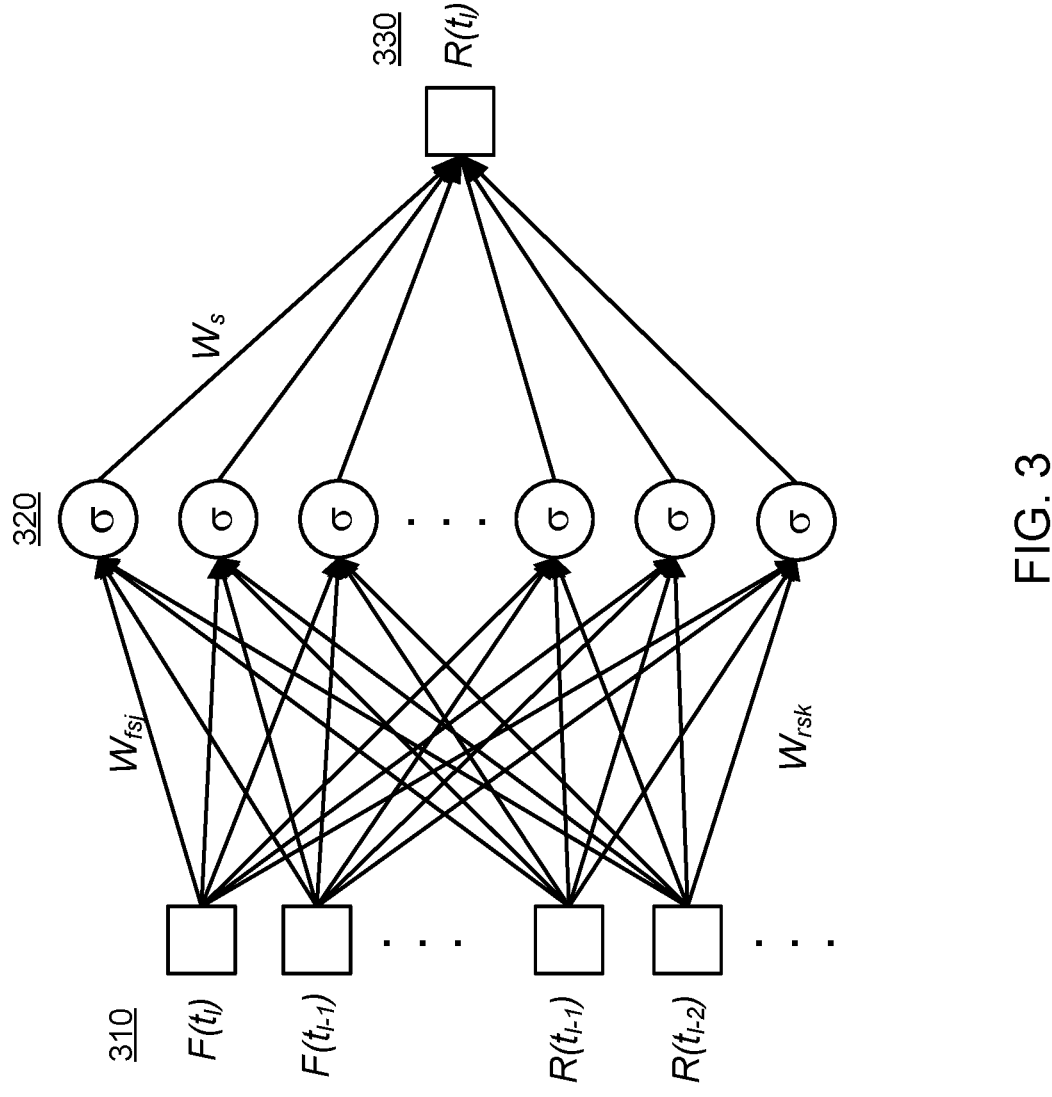
FIG. 3 shows the architecture of a neural network autoregressive exogenous model according to some embodiments of the disclosure.

FIG. 3 shows the architecture of an NNARX model. The input 310 to the neural network includes the delayed responses $\{R(t_{l\text{-}j}), j=1, \ldots, p\}$ and excitations $\{F(t_{l\text{-}j}), j=0, 1, \ldots, q\}$. The output 330 is the response at the current time step $R(t_l)$. The relationship between the input and the output can be written as:

$$R(t_l)=\Sigma_s W_s \sigma[\Sigma_j W_{fsj}F(t_{l\text{-}j})+\Sigma_k W_{rsk}R(t_{l\text{-}k})] \tag{10}$$

where $\sigma[\bullet]$ is the activation function as represented by nodes 320, $W_s$, $W_{fsj}$, and $W_{rsk}$ are the weights to be determined by solving the following least-squares problem:

$$\underset{W_s,W_{fsj},W_{rsk}}{\text{argmax}} \sum_m \tag{11}$$

$$\left\{ R_m(t_l) - \sum_s W_s \sigma \left[ \sum_j W_{fsj}F_m(t_{l\text{-}j}) + \sum_k W_{rsk}R_m(t_{l\text{-}k}) \right] \right\}^2$$

Back-propagation may be applied to iteratively solve for the weights. As an alternative, an extreme learning machine is used to train the model. For example, the weights $W_{fsj}$ and $W_{rsk}$ are randomly generated, and weights $W_s$ are obtained from solving a linear least-squares problem. The prediction accuracy is better than the model trained by the back-propagation technique. To further enhance the prediction accuracy, a regularization term is introduced. In addition, the activation function $\sigma[\bullet]$ is chosen to be a leaky rectified linear unit.

The surrogate model is not limited to the NNARX model. Other surrogate models include recurrent models such as different variants of recurrent neural networks.

Figure 4:
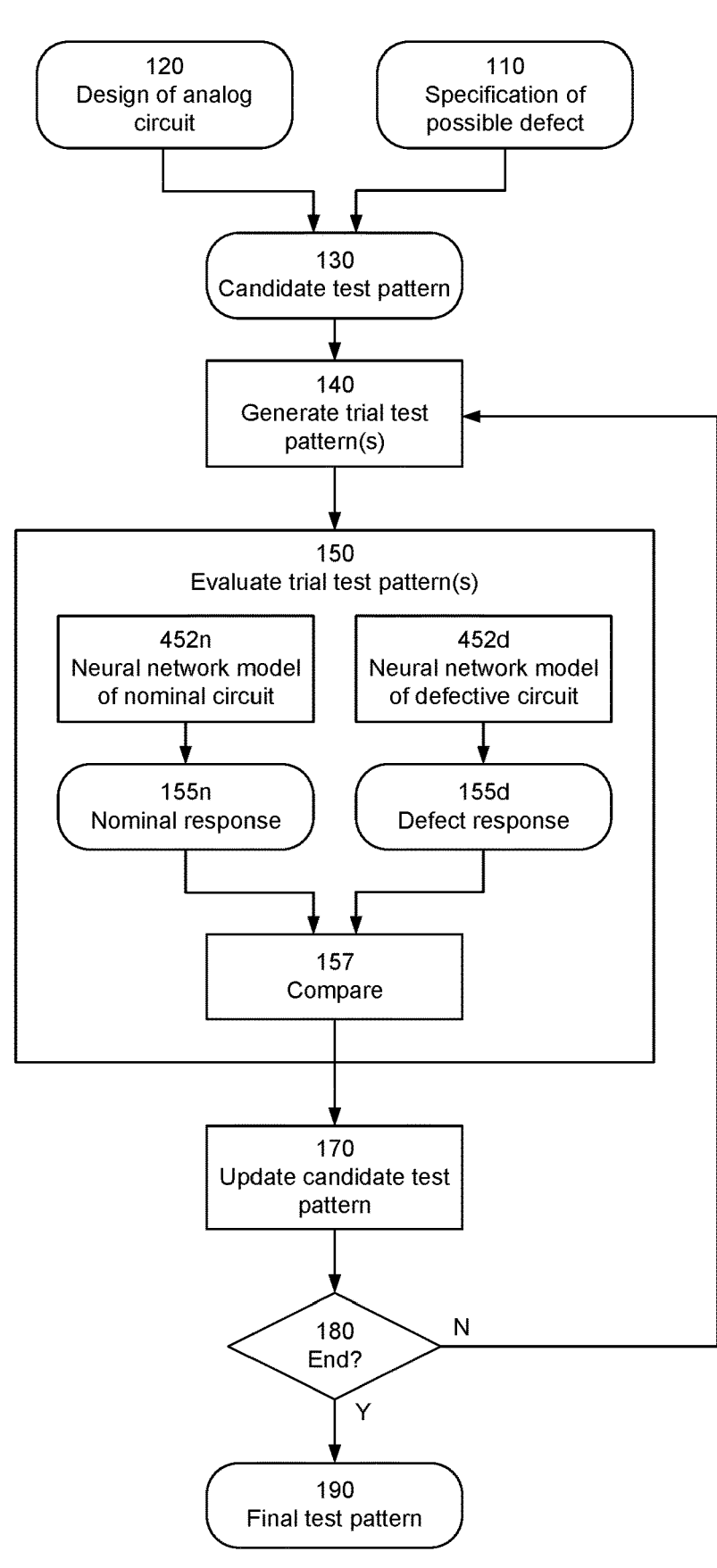
FIG. 4 is a flow diagram for generating a test pattern using a neural network model of transient simulation according to some embodiments of the disclosure.

For test pattern generation, the above surrogate model is applied to replace the transient simulator, as shown in FIG. 4. FIG. 4 is the same as FIG. 1, but the circuit models 452*n*, 452*d* are specified as neural network models. The responses 155*n*,155*d* are predicted by the neural network model, for example the output 330 of FIG. 3 for different time steps $t_l$. The excitations $\{F(t_{l\text{-}j}), j=0, 1, \ldots, q\}$ change during optimization. Using these excitations in conjunction with the responses at previous time steps, the responses at later time steps can be quickly calculated from this surrogate model.

In addition to acceleration of the circuit simulation, design time may also be reduced by using parallel optimization strategies. Many optimization methods, such as derivative-based schemes, are sequential where trial test patterns are evaluated one after another. The next trial test pattern cannot be determined until after the current trial test pattern is evaluated. Parallel optimization strategies allow the evaluation of multiple trial test patterns independent of each other. These evaluations may be run at the same time, for example on different machines or on distributed computing platforms, thus reducing the overall time to a solution.

Figure 5A:
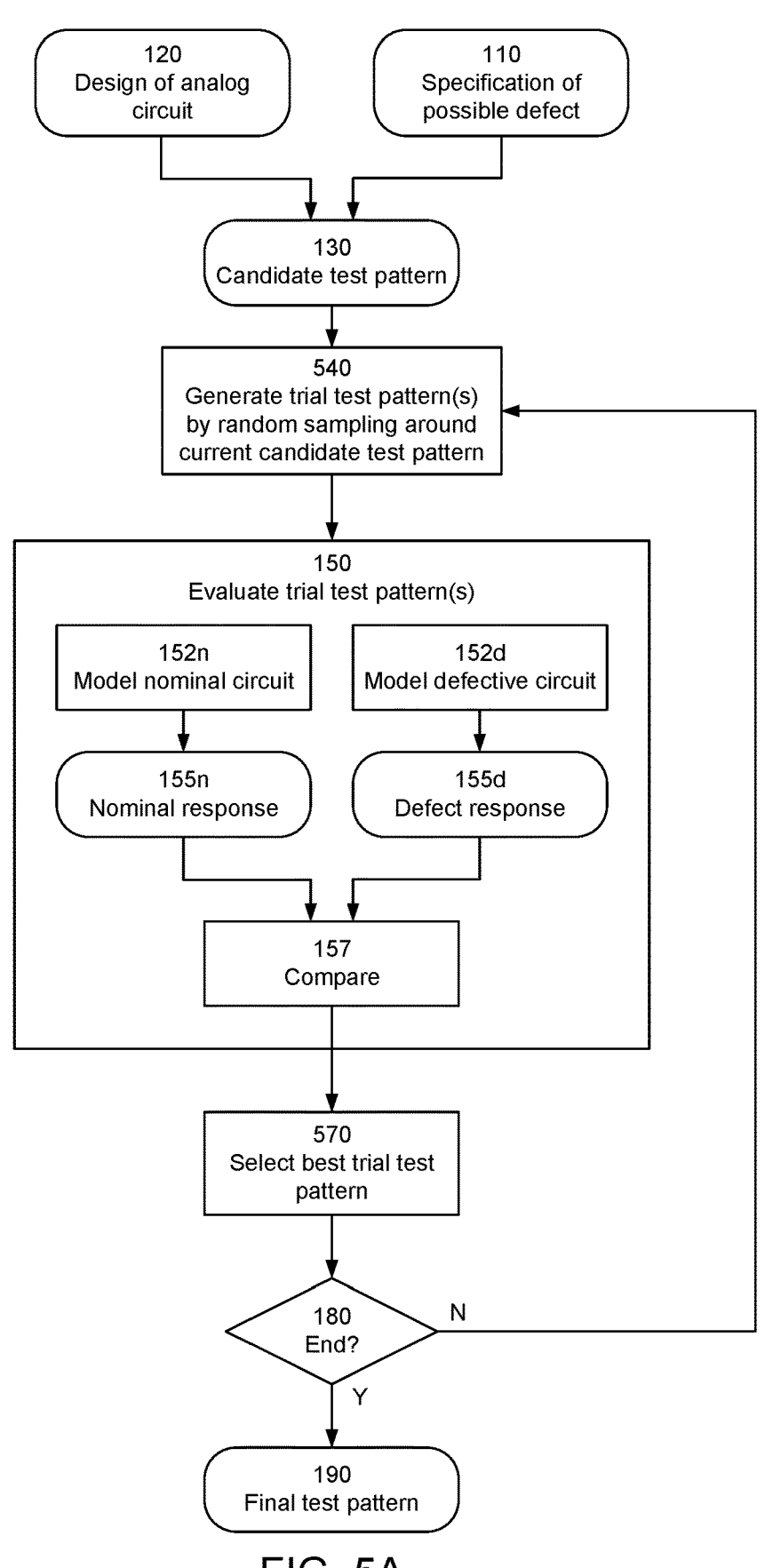
FIG. 5A is a flow diagram for generating a test pattern using parallelizable randomization according to some embodiments of the disclosure.

FIG. 5A is a flow diagram for generating a test pattern using parallelizable randomization. FIG. 5A is the same as FIG. 1, except step 140 is specified as a technique that is parallelizable. At 540, the trial test patterns for an iteration are generated by randomly sampling in a vicinity of the current candidate test pattern. In one approach, the test pattern is defined by a set of parameters or samples, and a population around the current candidate test pattern is generated using the Latin hypercube sampling method. At 150, these trial test patterns are evaluated. Any of the evaluation techniques described herein may be used, for example the AC simulation method, and the machine-learning based transient simulation method. At 570, the best trial test pattern is selected as the new current candidate test pattern. This is then repeated to 540. This procedure is highly parallelizable and therefore is very effective. Large number of trial test patterns may be evaluated in parallel on distributed computing platforms with many available machines.

Figure 5B:
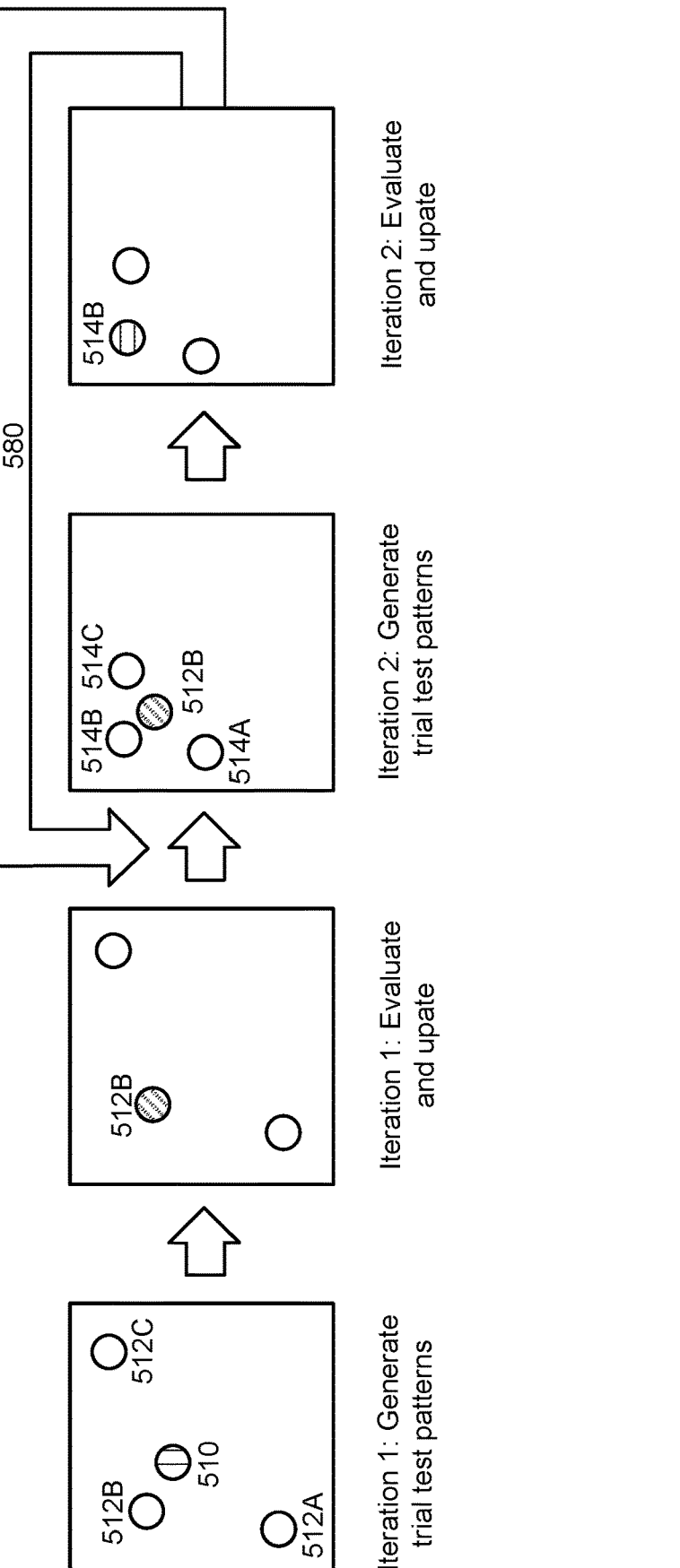
FIG. 5B is a pictorial representation that illustrates the flow diagram of FIG. 5A.

FIG. 5B is a pictorial representation that illustrates the flow diagram of FIG. 5A. Each square represents the space of possible test patterns. Each circle represents a different possible test pattern. The flow progresses from left to right. The first square represents iteration 1 generating trial test patterns (step 540 in FIG. 5A). Test pattern 510 (illustrated by vertical hatching) is the current candidate test pattern. Trial test patterns 512A, 512B, and 512C are generated in a neighborhood of the current best test pattern 510. In the second square, the trial test patterns 512 are evaluated and the candidate test pattern is updated (steps 150 and 570 in FIG. 5A). Test pattern 512B (illustrated by diagonal hatching) is determined to be the test pattern with the largest difference between nominal and defect responses. It becomes the new candidate test pattern. This process is repeated in the last two squares for the next iteration. In the third square, new trial test patterns 514A, 514B, and 514C are generated in the vicinity of test pattern 512B. In the fourth square, test pattern 514B (illustrated by horizontal hatching) is determined to be the best test pattern. Arrow 580 indicates that this may be repeated for multiple iterations.

Figure 6:
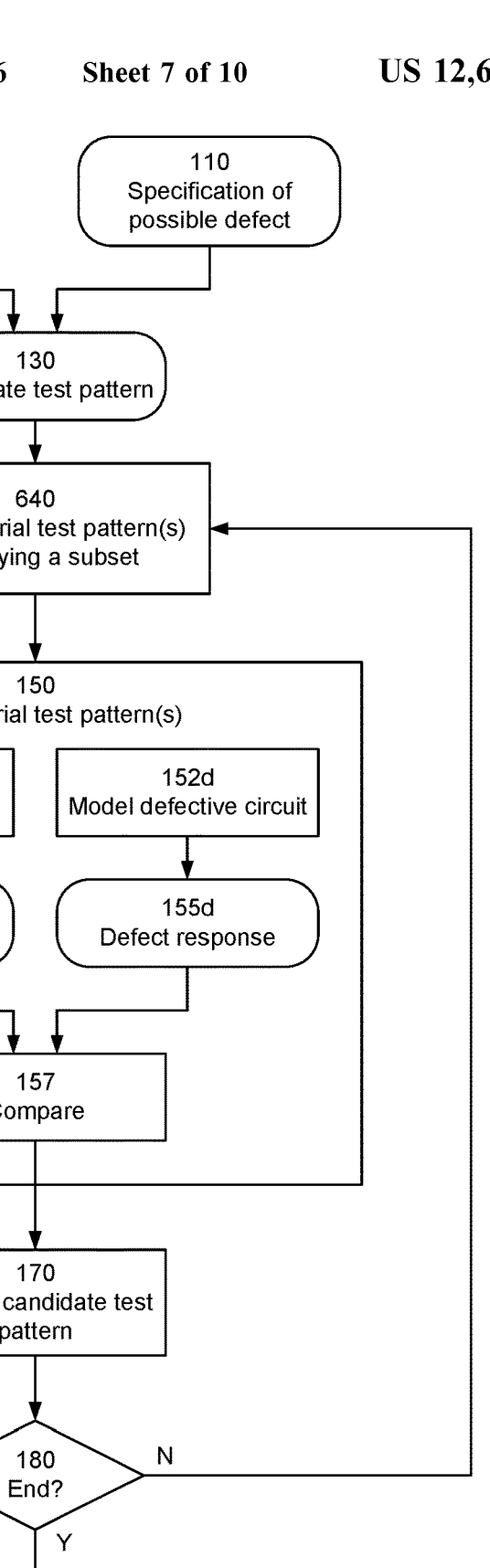
FIG. 6 is a flow diagram for generating a test pattern by subdividing the test pattern according to some embodiments of the disclosure.

When the number of variables to be optimized is large, for example greater than 50, convergence could be an issue. FIG. 6 is a flow diagram for generating a test pattern by subdividing the test pattern. If the test pattern is defined by a large number of variables, then the variables may be grouped into subsets. At 640, not all of the subsets are optimized on every iteration. For example, the test pattern is divided into three subsets. On iteration 1, subset 1 may be improved while holding subsets 2 and 3 constant. Then subset 2 may be improved while holding subsets 1 and 3 constant. Then subset 3 may be improved while holding subsets 1 and 2 constant. Different schedules may be used regarding which subsets are varied versus held constant. The schedule and subsets may also change as the flow progresses. For example, after some initial progress, the process may be stable enough to allow all variables to vary simultaneously.

Figure 7:
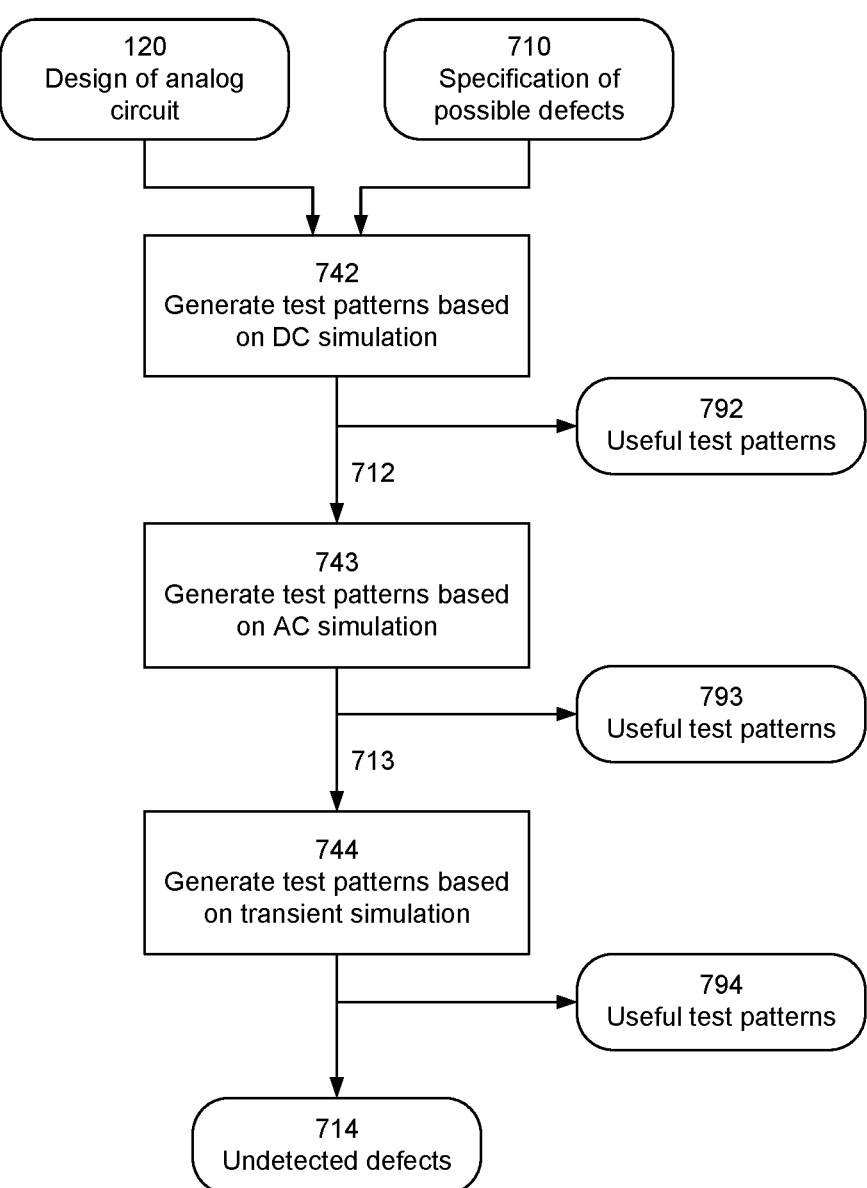
FIG. 7 is a flow diagram for generating a test pattern using a succession of different strategies according to some embodiments of the disclosure.

Different strategies may also be used together, for example progressing from less computationally expensive strategies to more computationally expensive ones. FIG. 7 is a flow diagram for generating a test pattern using a succession of different strategies. This particular example uses a succession of three different strategies. The goal is to determine effective test patterns for multiple different defects 710.

The first strategy 742 is based on a DC simulation of the analog circuit. This strategy attempts to find test patterns based on solving Eqn. (1) but using DC simulation, which is much less difficult than AC-based or transient-based simulations. Test patterns 792 from this second strategy that are useful to detect defects may be output. For any remaining defects 712 that are still not detectable, AC simulation 743 is applied, producing useful test patterns 793. Finally, transient simulation 744 may be applied to remaining defects 713, producing test patterns 794. There may be defects 714 that are not detectable by any of the trial test patterns. As described above, the AC simulation 743 may be accelerated by using CBFs, and the transient simulation 744 may be accelerated by using machine learning models. It is appreciated that present system and method may include one or more types of simulations for generating test patterns and the type of simulation for generating test patterns may be used in any order without deviating from the scope of the present disclosure.

Figure 8:
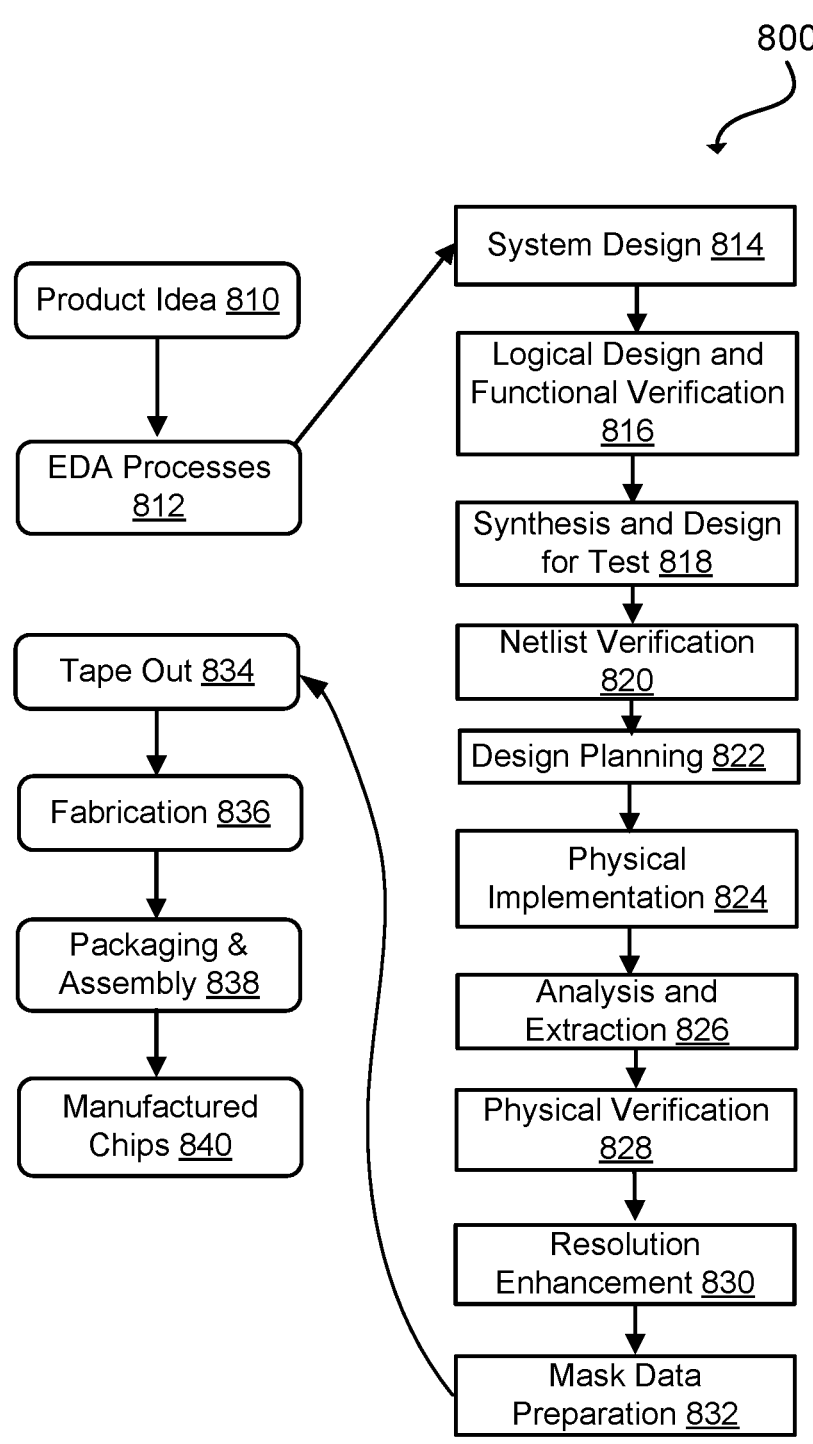
FIG. 8 depicts a flowchart of various processes used during the design and manufacture of an integrated circuit in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 8. The processes described by be enabled by EDA products (or EDA systems).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 9:
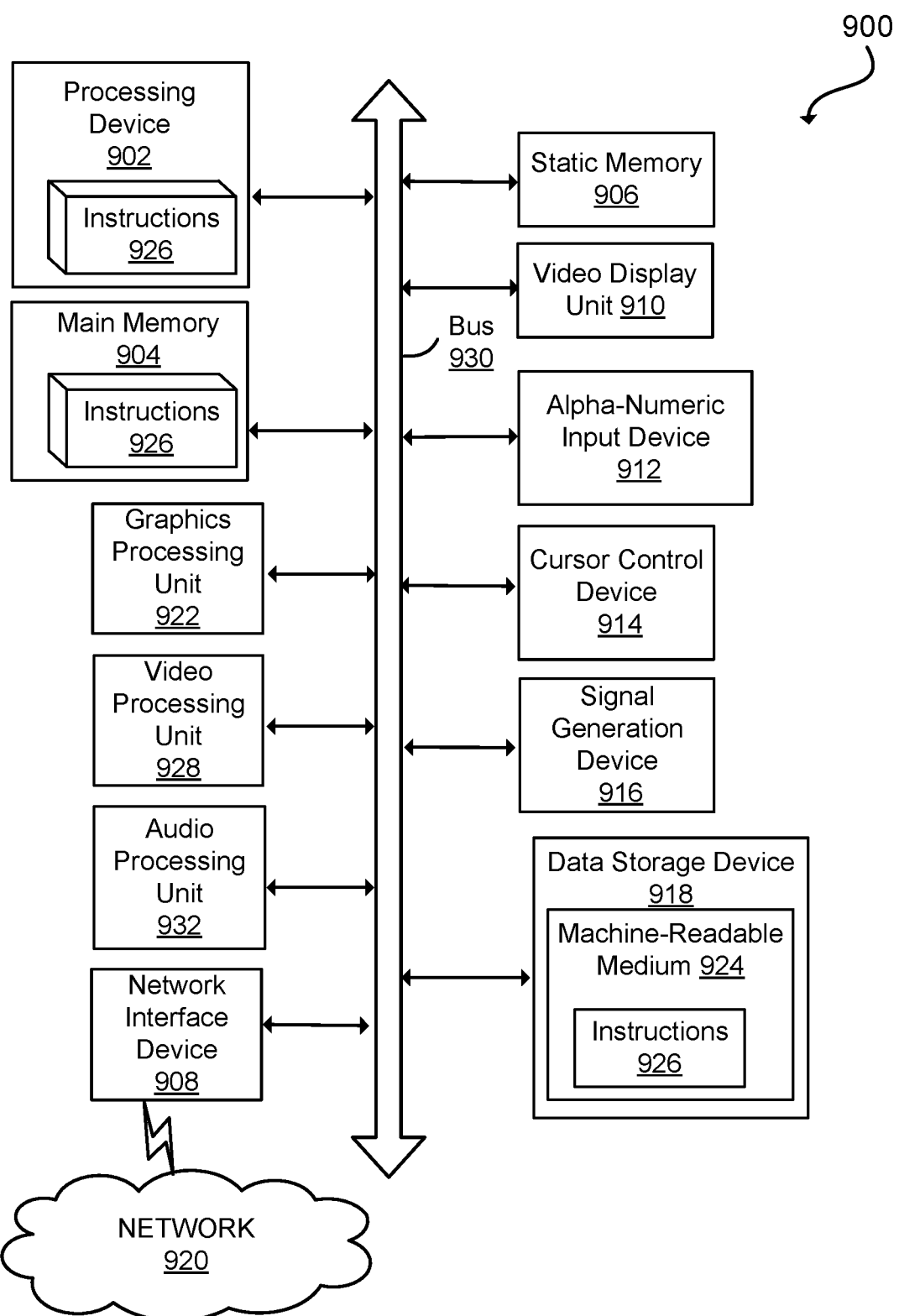
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:

receiving a description of an analog circuit and a specification of a defect that may occur in the analog circuit; and applying, by a processing device, a succession of at least two strategies for determining a test pattern to detect the specified defect, wherein two of the strategies in the succession are based on an AC simulation of the analog circuit and on a transient simulation of the analog circuit, and the strategy based on the AC simulation is applied before the strategy based on the transient simulation, each strategy comprising:

determining nominal responses and defect responses of the analog circuit to trial test patterns; wherein the nominal response is a response of the analog circuit without the specified defect, and the defect response is a response of the analog circuit with the specified defect; and selecting one or more of the trial test patterns as the test pattern based on differences between the nominal responses and defect responses for the trial test patterns.

2. The method of claim 1, wherein the specified defect is one of an open circuit, a short circuit, and a deviation from a nominal value for a component in the analog circuit; the test pattern comprises one or more waveforms applied to the analog circuit; and the response comprises a value of one or more waveforms produced by the analog circuit in response to the test pattern.

3. The method of claim 1, further comprising:

after applying the succession of strategies, testing a fabricated analog circuit using one or more of the selected trial test patterns.

4. The method of claim 1, wherein each strategy in the succession is more computationally expensive to apply than a prior strategy in the succession.

5. The method of claim 1, wherein the strategy based on the AC simulation uses characteristic basis functions.

6. The method of claim 1, wherein the strategy based on the transient simulation uses a neural network model of the transient simulation.

7. The method of claim 1, wherein another of the strategies in the succession is based on a DC simulation of the analog circuit;

and the strategies are applied in succession from the DC simulation strategy to the AC simulation strategy to the transient simulation strategy.

8. The method of claim 1, wherein the specification of the defect is determined by an end user.

9. A system comprising:

a memory storing instructions; and a processing device, coupled with the memory and to execute the instructions, the instructions when executed cause the processing device to:

receive a description of an analog circuit and a specification of a defect that may occur in the analog circuit; and apply multiple iterations of a strategy to update a test pattern to detect the defect, wherein each iteration comprises:

determining nominal responses and defect responses of the analog circuit to trial test patterns that are based on a current candidate test pattern;

wherein the nominal response is a response of the analog circuit without the specified defect, and the defect response is a response of the analog circuit with the specified defect; and updating the current candidate test pattern based on the differences between the nominal responses and the defect responses for the trial test patterns; and wherein the test patterns comprise a plurality of variables and applying the multiple iterations comprises:

subdividing the variables into subsets; and for at least some iterations, the trial test patterns are generated by varying at least one subset of the subsets of variables.

10. The system of claim 9, wherein for each iteration, the trial test patterns randomly sample a vicinity of the current candidate test pattern.

11. The system of claim 9, wherein for each iteration, the nominal responses and defect responses of the analog circuit to each trial test pattern are determinable independent of the responses to the other trial test patterns.

12. The system of claim 9, wherein for each iteration, updating the current candidate test pattern comprises replacing the current candidate test pattern with the trial test pattern that has a desired difference between its nominal response and its defect response.

13. A non-transitory computer readable medium comprising stored instructions, which when executed by a processing device, cause the processing device to:

receive a description of an analog circuit and a specification of a defect that may occur in the analog circuit;

perform alternating current (AC) simulations of the analog circuit to determine nominal responses and defect responses of the analog circuit to trial test patterns; wherein the nominal response is a response of the analog circuit without the specified defect, the defect response is a response of the analog circuit with the specified defect, the AC simulation is implemented in a frequency domain, and a frequency domain response of the analog circuit is based on characteristic basis functions that sample the frequency domain response at basis frequencies and expressing the frequency domain response at other frequencies as a linear combination of the characteristic basis functions; and select one or more of the trial test patterns based on differences between the nominal responses and the defect responses for the trial test patterns.

14. The non-transitory computer readable medium of claim 13, wherein selecting one or more of the trial test patterns is based on increasing the difference between the nominal responses and the defect responses.

15. The non-transitory computer readable medium of claim 13, wherein selecting one of the trial test patterns comprises selecting the frequency domain responses at the basis frequencies based on increasing the difference between the nominal responses and the defect responses.

16. The non-transitory computer readable medium of claim 13, wherein the AC simulation is based on a linear model of a behavior of the analog circuit using a small signal assumption.

* * * * *